United States Patent
Bottarel et al.

(10) Patent No.: US 8,791,727 B2
(45) Date of Patent: *Jul. 29, 2014

(54) LOW VOLTAGE ISOLATION SWITCH, IN PARTICULAR FOR A TRANSMISSION CHANNEL FOR ULTRASOUND APPLICATIONS

(71) Applicant: STMicroelectronics S.r.l., Agrate Brianza (IT)

(72) Inventors: Valeria Bottarel, Novara (IT); Giulio Ricotti, Broni (IT); Fabio Quaglia, Pizzale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 13/907,468

(22) Filed: May 31, 2013

(65) Prior Publication Data

US 2013/0265100 A1 Oct. 10, 2013

Related U.S. Application Data

(63) Continuation-in-part of application No. PCT/IT2010/000511, filed on Dec. 23, 2010.

(51) Int. Cl.
*H03K 3/00* (2006.01)
*H03B 1/00* (2006.01)

(52) U.S. Cl.
USPC ........................................ 327/112; 327/108

(58) Field of Classification Search
USPC .................. 327/427, 434, 365, 436, 108, 112
See application file for complete search history.

(56) References Cited

U.S. PATENT DOCUMENTS

| | | | |
|---|---|---|---|
| 6,050,945 A | 4/2000 | Peterson et al. | |
| 6,269,052 B1 | 7/2001 | Oppelt | |
| 8,542,056 B2 * | 9/2013 | Rossi et al. | 327/427 |
| 8,547,161 B1 * | 10/2013 | Dalal et al. | 327/434 |
| 2003/0016072 A1 | 1/2003 | Ramakrishnan | |
| 2005/0154300 A1 | 7/2005 | Wodnicki et al. | |
| 2007/0159229 A1 | 7/2007 | De Haas | |
| 2009/0206676 A1 | 8/2009 | Chu et al. | |

FOREIGN PATENT DOCUMENTS

DE 102004033254 A1 3/2005

* cited by examiner

*Primary Examiner* — Hai L Nguyen
(74) *Attorney, Agent, or Firm* — Seed IP Law Group PLLC

(57) ABSTRACT

A low voltage isolation switch is suitable for receiving from a connection node a high voltage signal and transmitting said high voltage signal to a load via a connection terminal. The isolation switch includes a driving block connected between first and second voltage reference terminals and including a first driving transistor coupled between the first voltage reference (Vss) and a first driving circuit node and a second driving transistor coupled between the driving circuit node and the second supply voltage reference. The switch comprises an isolation block connected to the connection terminal (pzt), the connection node, and the driving central circuit node and including a voltage limiter block, a diode block and a control transistor. The control transistor is connected across the diode block between the connection node and the connection terminal and has a control terminal connected to the driving central circuit node.

19 Claims, 6 Drawing Sheets

LOW VOLTAGE ISOLATION SWITCH, IN PARTICULAR FOR A TRANSMISSION CHANNEL FOR ULTRASOUND APPLICATIONS

BACKGROUND

1. Technical Field

The present disclosure relates to a low voltage isolation switch.

The disclosure also relates to a transmission channel of a high voltage signal to a load, in particular a piezoelectric transducer and to a relative driving method.

The disclosure particularly, but not exclusively, relates to a low voltage switch for a transmission channel for ultrasound applications and the following description is made with reference to this field of application by way of illustration only.

2. Description of the Related Art

As it is well known, the sonography or ultrasonography is a system of medical diagnostic testing that uses ultrasonic waves or ultrasounds and is based on the principle of the transmission of the ultrasounds and of the emission of echo and is widely used in the internal medicine, surgical and radiological fields.

The ultrasounds normally used are comprised between 1 and 20 MHz. The frequency is chosen taking into consideration that higher frequencies have a greater image resolving power, but penetrate less in depth in the subject under examination.

These ultrasounds are normally generated by a piezoceramic crystal inserted in a probe maintained in direct contact with the skin of the subject with the interposition of a suitable gel (being suitable for eliminating the air between probe and subject's skin, allowing the ultrasounds to penetrate in the anatomic segment under examination). The same probe is able to collect a return signal or echo, which is suitably processed by a computer and displayed on a monitor.

In particular, the ultrasounds that reach a variation point of the acoustic impedance, and thus for example an internal organ, are partially reflected and the percentage reflected conveys information about the impedance difference between the crossed tissues. It is to be noted that, the big impedance difference between a bone and a tissue being considered, with the sonography it is not possible to see behind a bone, which causes a total reflection of the ultrasounds, while air or gas zones give "shade", causing a partial reflection of the ultrasounds.

The time employed by an ultrasonic wave for carrying out the path of going, reflection and return is provided to the computer, which calculates the depth wherefrom the echo has come, thus identifying the division surface between the crossed tissues (corresponding to the variation point of the acoustic impedance and thus to the depth wherefrom the echo comes).

Substantially, an ultrasonographer, in particular a diagnostic apparatus based on the ultrasound sonography, comprises three parts:

a probe comprising at least one transducer, in particular of the ultrasonic type, which transmits and receives an ultrasound signal;

an electronic system that drives the transducer for the generation of the ultrasound signal or pulse to be transmitted and receives an echo signal of return at the probe of this pulse, processing in consequence the received echo signal; and a displaying system of a corresponding sonographic image processed starting from the echo signal received by the probe.

In particular, the word transducer generally indicates an electric or electronic device that converts a type of energy relative to mechanical and physical magnitudes into electric signals. In a broad sense, a transducer is sometimes defined as any device that converts energy from a form to another, so that this one can be re-processed either by men or by other machines. Many transducers are both sensors and actuators. An ultrasonic transducer usually comprises a piezoelectric crystal that is suitably biased for causing its deformation and the generation of the ultrasound signal or pulse.

Ultrasonic transducers for sonography images are usually driven by high voltage driving circuits or drivers able to generate a sinusoidal signal of variable width comprised between 3 and 200 Vpp (200 Vpp being a value of power voltage) and frequencies in the range 1 MHz to 20 MHz, this sinusoidal signal being a control signal for corresponding generators of the ultrasound pulse to be transmitted, in particular piezoelectric crystals.

The corresponding driving circuits are thus made of components that sustain these high voltages and that, also given the frequencies at stake, supply currents high enough to a load applied at the output, in particular an ultrasonic transducer.

Such high voltages lead to use components with rather big sizes. These components however add high parasite capacitances in parallel to the transducer.

Moreover, the transducer itself is also used for the receiving in a transmission channel for these ultrasound applications. Typically, an ultrasonic transducer transmits a high voltage pulse of the duration of a few μs, and receives the echo of this pulse, generated by the reflection on the organs of a subject under examination, for the duration of about 250 μs, for going back to the transmission of a new high voltage pulse. For example, a first pulse IM1 and a second pulse IM2 are transmitted with a peak to peak excursion equal, in the example shown, to 190 Vpp with reception by the transducer of corresponding echoes indicated with E1 and E2, as schematically shown in FIG. 1.

The echo signal or return acoustic wave is converted into an electric wave that turns out to be a signal of some millivolts of width, signal that is then amplified by low noise amplifier circuits, connected to the transducer itself, in turn disturbed by the parasite capacity due to the high voltage components of the driving circuit of the transducer. This reduces the quality of the echo signal.

BRIEF SUMMARY

One embodiment of the present disclosure reduces the effect of the parasite capacitances of the high voltage components of a driving circuit, in particular for an ultrasonic transducer in a transmission channel for ultrasound applications.

One embodiment of the present disclosure is an isolation switch realized using low voltage elements, in such a way to have a really low parasitic capacitance. The switch is part of the transmission channel interposed between the output terminal connected to the ultrasonic transducer and the high voltage components of the driving circuit. The switch has such structural and functional characteristics as to ensure a correct transmission in this transmission channel of high voltage signals for the transmission of an ultrasonic pulse to an output terminal connected to this transducer, and in the meantime to ensure the correct isolation of this terminal at the reception of an echo signal, thus overcoming the limits and the drawbacks still affecting the systems realized according to the prior art.

One embodiment of the present disclosure is a low voltage isolation switch electrically coupled between a connection node and a matrix of switches suitable for receiving a high voltage signal and a connection terminal to a load suitable for transmitting said high voltage signal to said load. The switch includes at least one driving block electrically coupled between a first and a second voltage reference and comprising at least a first driving transistor, electrically coupled in series with a first driving diode between said first voltage reference and a first driving central circuit node, and a second driving transistor electrically coupled in series with a second driving diode between said driving central circuit node and said second supply voltage reference. The switch also includes an isolation block connected to the connection terminal, to said connection node and to said driving central circuit node, said isolation block comprising a voltage limiter block, a diode block and a control transistor, in turn connected across said diode block between said connection node to a matrix of switches suitable and said connection terminal to a load of said low voltage isolation switch and having a control terminal connected to said driving central circuit node.

More in particular, the disclosure comprises the following supplementary and optional features, taken alone or in combination, if needed.

According to an aspect of the disclosure, said voltage limiting block can comprise at least one first and one second voltage limiter circuit connected between a first and a second inner circuit node, said first inner circuit node being connected, through a resistor, to said driving central circuit node and said second inner circuit node being connected to said connection node.

According to this aspect of the disclosure, said diode block may comprise at least one first and one second transmission diode, connected in antiparallel, i.e. by having an anode terminal of said first diode connected to a cathode terminal of said second diode and vice versa between said connection terminal and said second inner circuit node.

According to another aspect of the disclosure, said control terminal of said control transistor may be connected to said first inner circuit node.

Furthermore, according to an aspect of the disclosure, said control transistor may be a low voltage N channel MOS transistor.

One embodiment of the present disclosure is a transmission channel for transmitting a high voltage signal from an input terminal to a load. The transmission channel includes at least one matrix of high voltage switches electrically coupled between said input terminal and a high voltage terminal, low voltage isolation switch connected between said high voltage terminal and said connection terminal, and a transmission switch connected between the connection terminal and a low voltage output terminal connected to a low noise amplifier.

According to an aspect of the disclosure, said transmission channel may transmit an ultrasound pulse as high voltage signal and said load may be a piezoelectric transducer.

The characteristics and the advantages of the low voltage isolation switch and of the transmission channel according to the disclosure will be apparent form the following description of an embodiment thereof given by way of indicative and non limiting example with reference to the annexed drawings.

DETAILED DESCRIPTION

Figure 1:
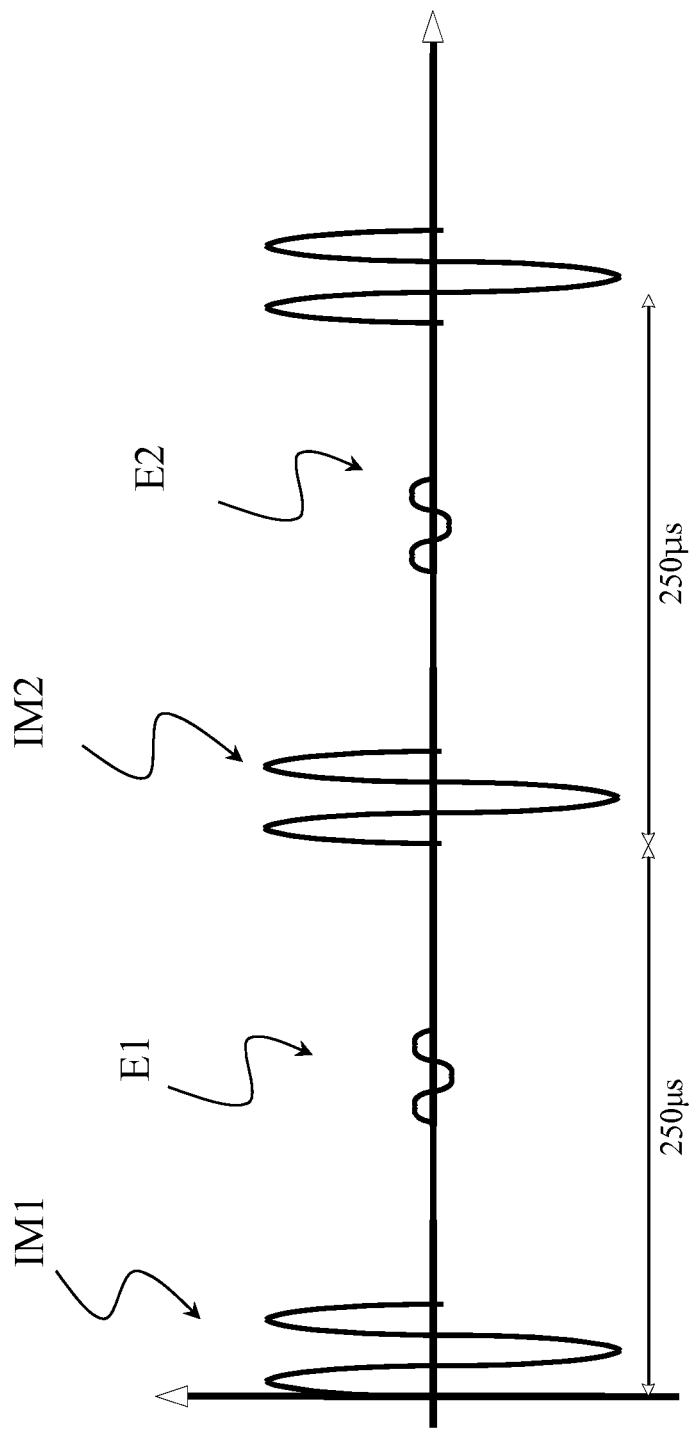
FIG. 1 schematically shows a first and a second ultrasound pulse being generated by a driving circuit and thereby applied to an ultrasonic transducer according to the prior art.
Figure 2A:
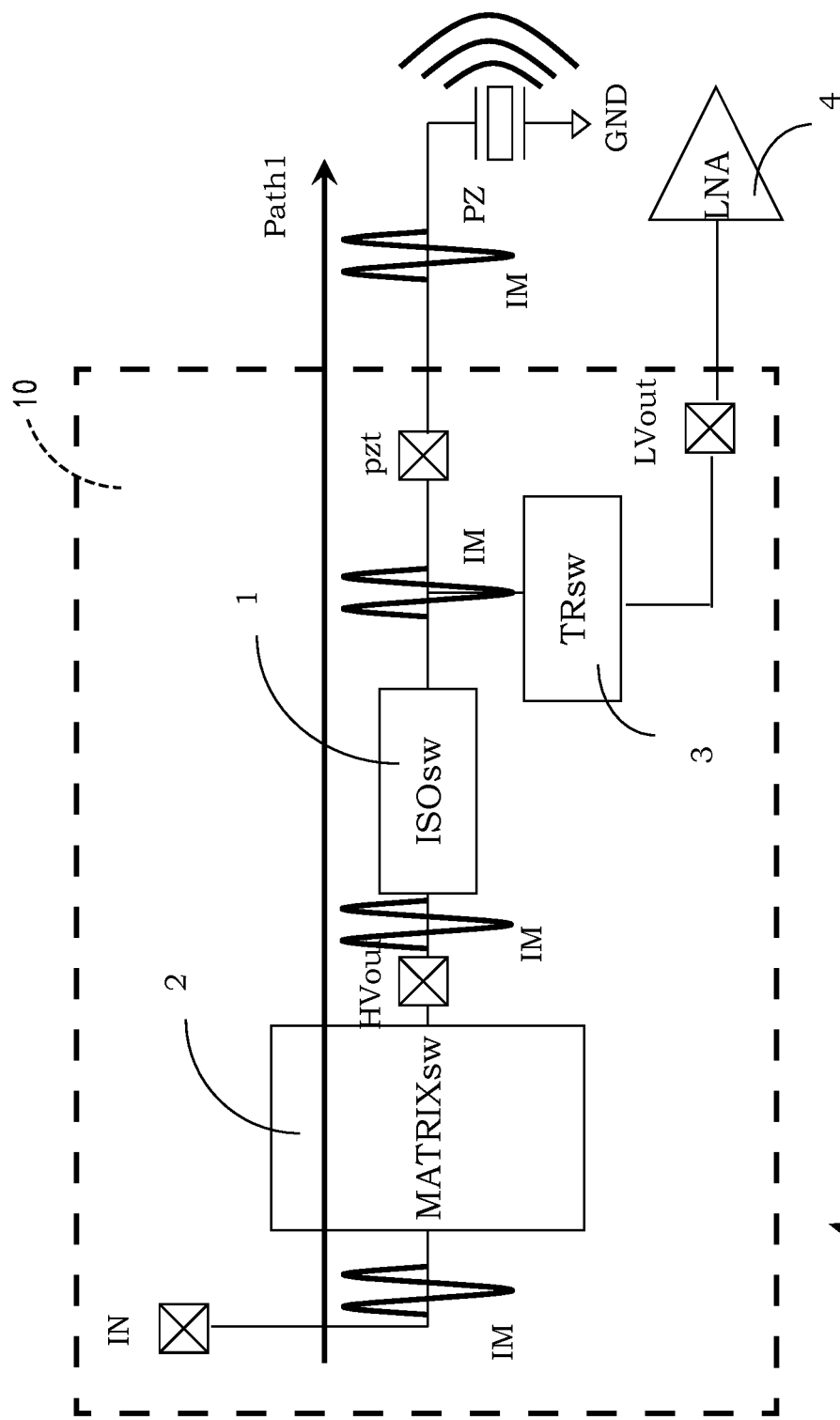
FIGS. 2A-2C schematically show a transmission channel for ultrasound applications according to an embodiment of the disclosure, when in a first, a second and a third working condition, respectively.
Figure 2B:
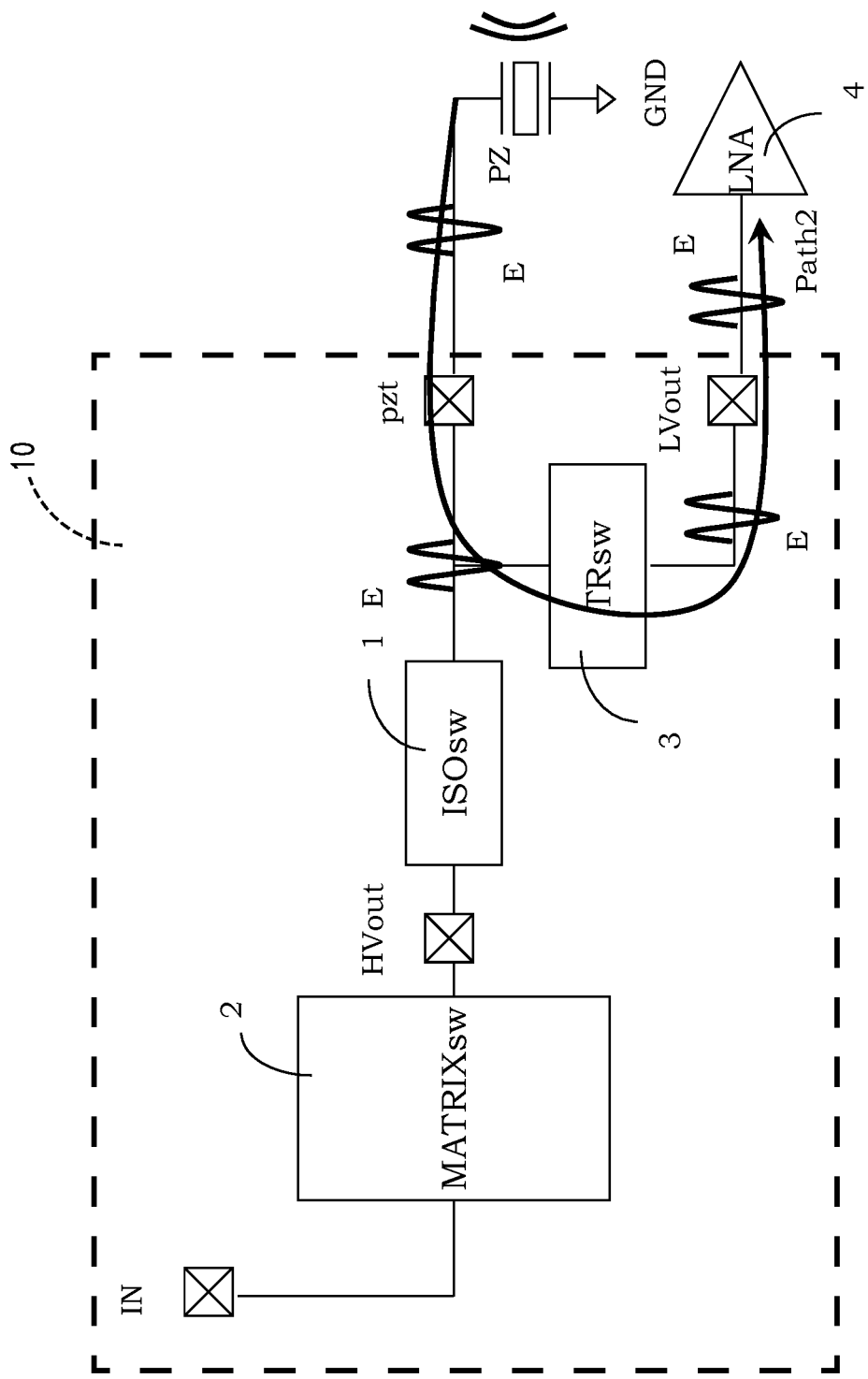
Figure 2C:
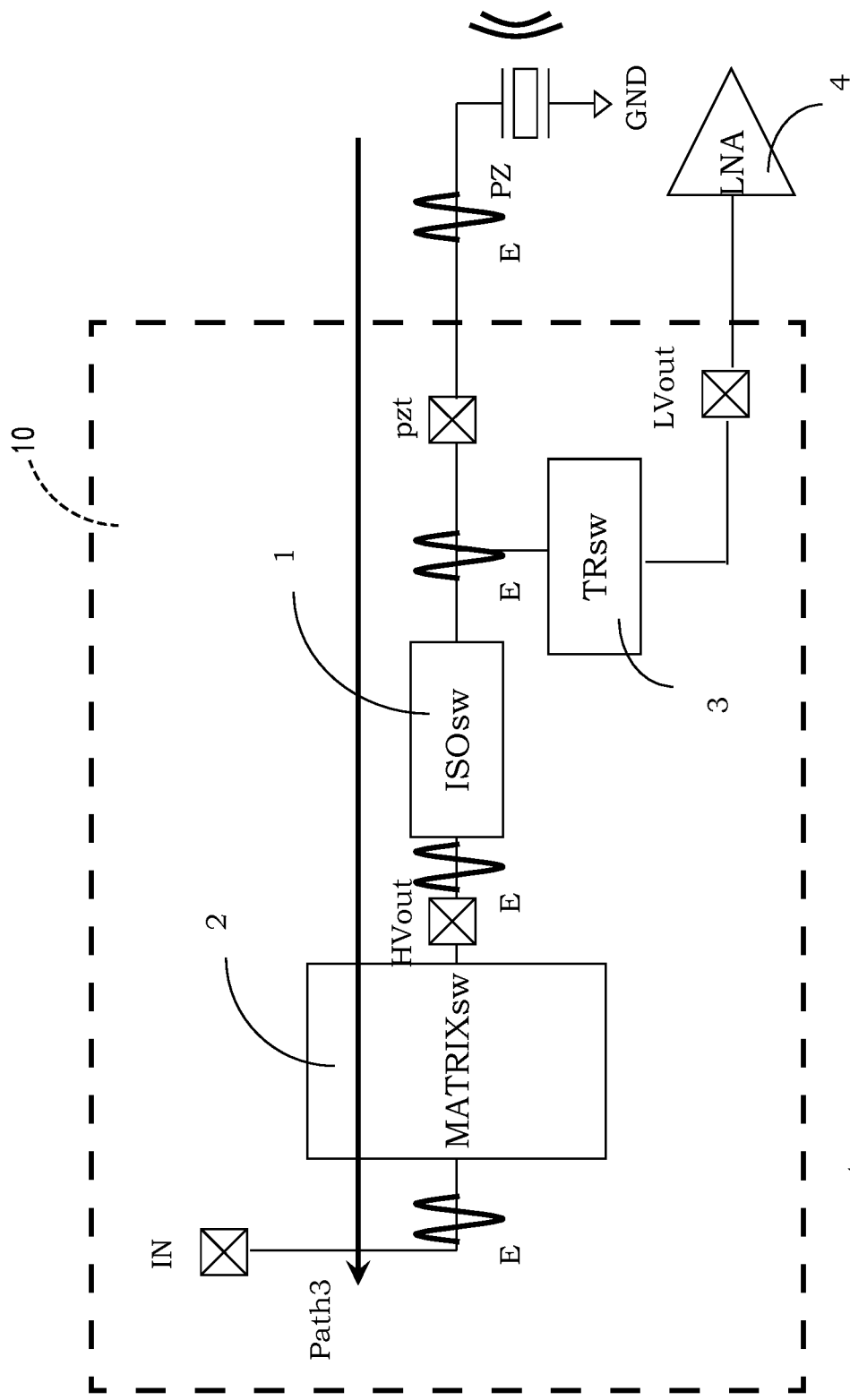

FIGS. 2A, 2B and 2C, show an ultrasound device 100 that includes a transmission channel 10 and an ultrasound transducer, in particular a piezoelectric transducer PZ.

By way of illustration, only an output section of the transmission channel 10 has been actually shown being connected to the piezoelectric transducer PZ and supplying it with an impulsive signal IM generated by suitable circuitry (not shown) and already on an input terminal IN of the transmission channel 10.

In particular, the transmission channel 10 first of all comprises a matrix 2 of high voltage switches (MATRIXsw) electrically coupled between the input terminal IN and a high voltage terminal HVout, whereto the input impulsive signal IM is transmitted.

Furthermore, the transmission channel 10 comprises a low voltage output terminal LVout connected to a low voltage amplifier 4 (LNA) and a connection terminal pzt connected to the piezoelectric transducer PZ. The transmission channel 10 also comprises at least one transmission switch 3 (TRsw) connected between the connection terminal pzt and the low voltage output terminal LVout.

According to an aspect of the disclosure, the transmission channel 10 also comprises an isolation switch 1 (ISOsw), in particular a low voltage switch, connected between the high voltage terminal HVout of the matrix 2 of switches and the connection terminal pzt. In this way, the high voltage terminal HVout is connected to the low voltage output terminal LVout through the low voltage isolation switch 1 and of the transmission switch 3.

The use of the low voltage isolation switch 1 allows to overcome the problem of the high parasitic capacitance due to the high voltage components of the matrix 2 of switches. In particular, as it will be clarified hereafter in the description, this low voltage isolation switch 1 only comprises low voltage elements having a really low parasitic capacitance.

According to a first working condition, in particular a transmission mode of a pulse IM to the connection terminal pzt to the piezoelectric transducer PZ, as shown in FIG. 2A according to the path indicated as Path1, the matrix 2 of switches is turned on for transmitting this pulse IM from the input terminal IN towards the high voltage terminal HVout. Moreover, the transmission switch 3 is off and the pulse IM is transmitted through the low voltage isolation switch 1, thanks to the presence within the low voltage isolation switch 1 of a diode block 7 connected to the connection terminal pzt, as it will be explained hereafter in the description.

According to a second working condition, in particular a first reception mode of an echo signal E through the transmission switch 3, as shown in FIG. 2B according to the path indicated as Path2, the matrix 2 of switches and the low voltage isolation switch 1 are off and the transmission switch 3 is turned on, the echo signal E flows from the piezoelectric transducer PZ through the connection terminal pzt to towards the second output terminal LVout, and then to the low voltage amplifier 4.

Finally, according to a third working condition, in particular a second reception mode of an echo signal E through the matrix 2 of switches, as shown in FIG. 2C according to the path indicated as Path3, the matrix 2 of switches and the low voltage isolation switch 1 are on and the transmission switch 3 is switched off, the echo signal E flowing from the piezoelectric transducer PZ through the connection terminal pzt towards the high voltage terminal HVout and then to the input terminal IN.

Figure 3:
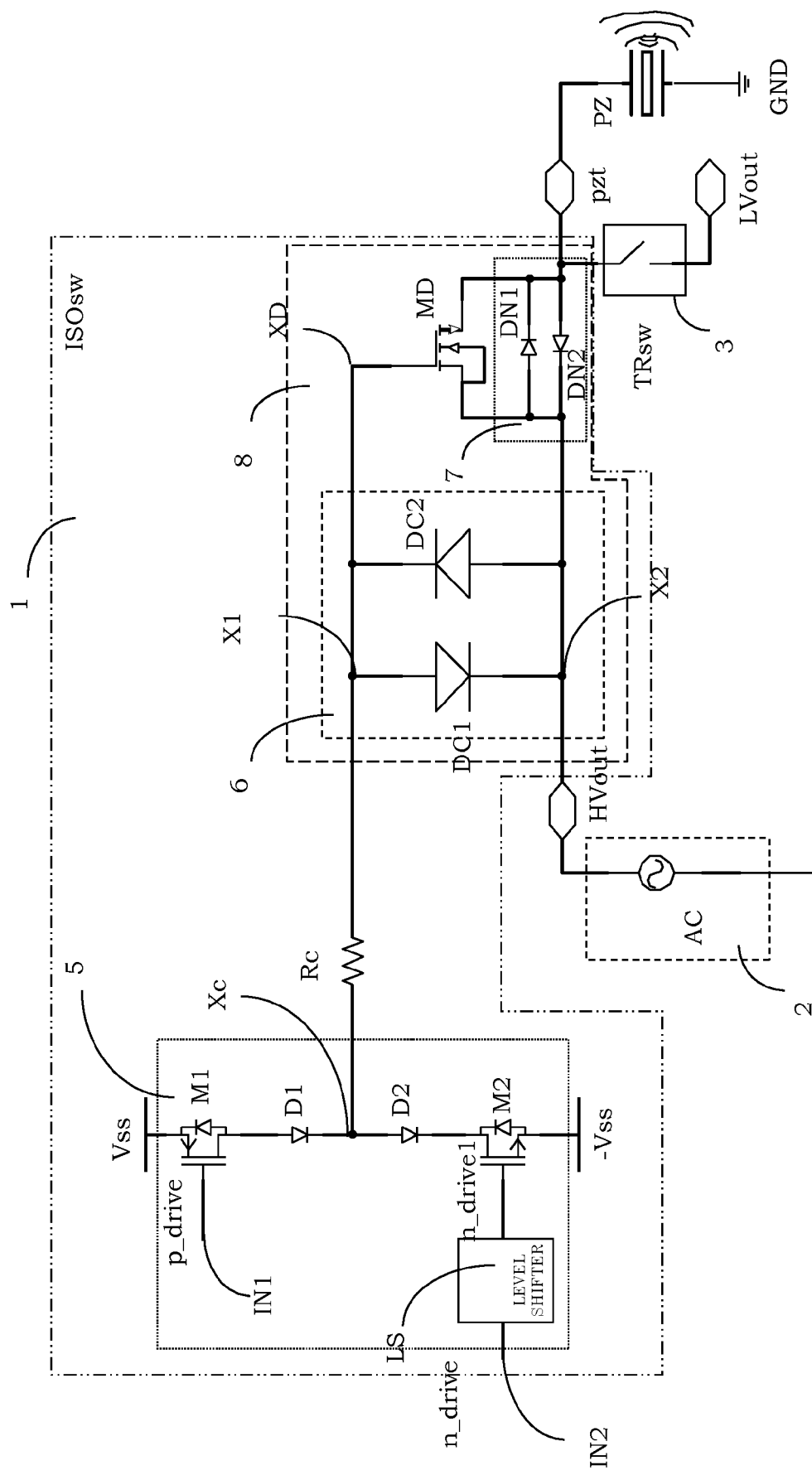
FIG. 3 schematically shows a low voltage switch according to an embodiment of the disclosure.

The low voltage isolation switch 1 according to the disclosure is shown in greater detail in FIG. 3.

In particular, by way of illustration, in this FIG. 3, the matrix 2 of switches is simply indicated as a high voltage block AC connected to the first output terminal HVout.

The low voltage isolation switch 1 actually is a bidirectional element. When in its first working condition, i.e. when in the transmission mode, the high voltage terminal HVout of the matrix 2 of switches is an input terminal of the low voltage isolation switch 1 and receives a high voltage signal, while the connection terminal pzt is an output terminal of the low voltage isolation switch 1 and transmits this high voltage signal to a load, in particular the piezoelectric transducer PZ. When in its second and third working conditions, instead, an echo signal is received, through the transmission switch 3 or the matrix 2 of switches, respectively. In this case, the high voltage terminal HVout of the matrix 2 of switches is an output node of the low voltage isolation switch 1.

In the following description, the high voltage terminal HVout of the matrix 2 of switches will be thus indicated as a connection node HVout of the switch 1 to the matrix 2 of switches, which node could be then driven by a high voltage signal, in particular in the first working condition as above described.

The low voltage isolation switch 1 comprises a driving block 5 electrically coupled between a first and a second voltage reference, respectively a positive power supply Vss and a negative power supply −Vss, and comprises the series of a first driving transistor M1 and a first diode D1 electrically coupled between the positive supply voltage reference Vss and a first driving central circuit node Xc, the first driving transistor M1 having a control or gate terminal connected to a first input terminal IN1 of the driving block 5 receiving a first driving signal, p_drive from a controller (not shown).

The driving block 5 also comprises the series of a second diode D2 and a second driving transistor M2 electrically coupled between the driving central circuit node Xc and the negative supply voltage reference −Vss, the second driving transistor M2 having a control or gate terminal connected to a level shifter LS in turn connected to a second input terminal IN2 of the driving block 5 receiving a second driving signal, n_drive from the controller. The level shifter LS also has an inversion function that allows to transform a positive supply voltage value into a negative supply voltage value, leaving a value of 0V corresponding to the ground unaltered and supplies the control terminal of the second driving transistor M2 with an inverted driving signal n_drive1.

In particular, the level shifter LS is configured to adapt the voltage levels of the first driving signal n_drive, usually generated by a logic circuit of the controller, and thus likely a low logic lever, or "0", corresponding to the ground GND value and a high logic lever, or "1", corresponding to a positive supply voltage Vss value. The level shifter is thus a logic level shifter from [Vss; 0] to [0; −Vss].

In the embodiment of FIG. 3, the first driving transistor M1 is a P channel MOS transistor, while the second driving transistor M2 is an N channel MOS transistor. These driving transistors are high voltage transistors and are supplied by low supply voltage references, Vss and −Vss, in particular equal to 3.3V.

According to an aspect of the disclosure, the low voltage isolation switch 1 comprises an isolation block 8 connected by the connection terminal pzt to the piezoelectric transducer PZ, by the high voltage terminal HVout to the matrix 2 of switches, as well as to the driving central circuit node Xc.

The isolation block 8 comprises a voltage limiter block 6, a diode block 7 and a control transistor MD having a control or gate terminal XD.

According to an aspect of the disclosure, the voltage limiter block 6 comprises first DC1 and second voltage limiter circuits DC1, DC2 schematized as diodes connected in antiparallel, i.e. by having the anode terminal of the first diode connected to the cathode terminal of the second one and vice versa, between a first X1 and a second inner circuit node X2. More in particular, the first inner circuit node X1 is connected, through a resistor Rc, to the driving central circuit node Xc, as well as to the control terminal XD of the control transistor MD, while the second inner circuit node X2 is connected to the high voltage node HVout to the matrix 2 of switches.

These voltage limiter circuits, DC1 and DC2, limit the voltage between the gate and source terminals (Vgs) of the control transistor MD and prevent that the same is damaged due to too high values of this voltage.

Figure 4B:
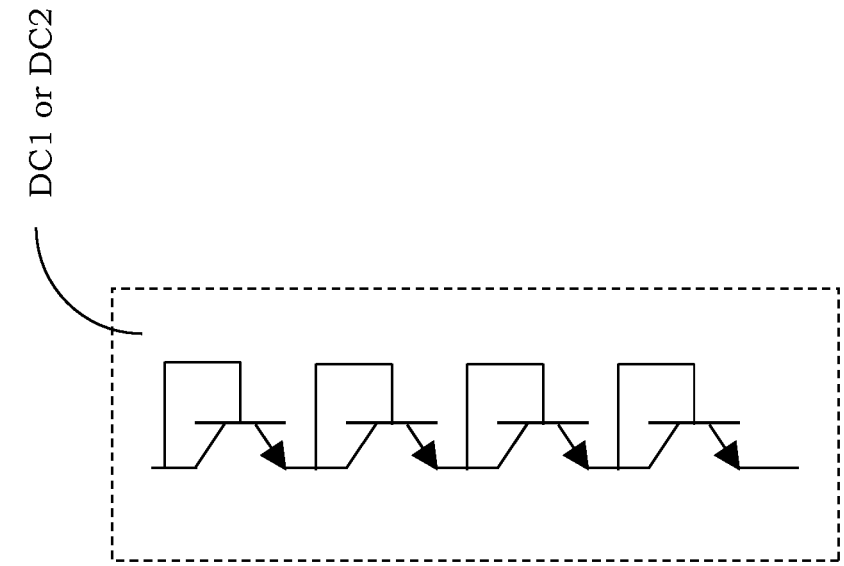
FIGS. 4A and 4B schematically show embodiments of a voltage limitation circuit comprised into the switch of FIG. 3.
Figure 4A:
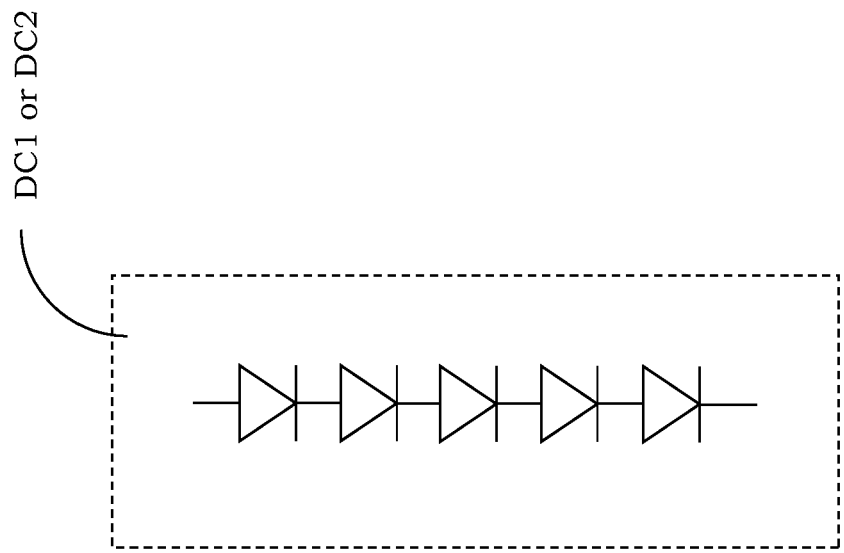

It is possible to realize these voltage limiter circuits, for example, through a series of diodes or other equivalent structures, even more complex, that can also be realized with transistors, as schematically shown in FIGS. 4A and 4B.

In the case of diodes, that have maximum voltage equal to 0.7V in pass condition, it will be possible to use the series of five diodes (5*0.7V=3.5V) for protecting a control transistor MD of class 3.3V, for example.

Moreover, the diode block 7 comprises first and second transmission diodes DN1, DN2, connected in antiparallel, i.e. by having the anode terminal of the first diode connected to the cathode terminal of the second and vice versa, between the connection terminal pzt and the second inner circuit node X2. In the example of the figure, the first transmission diode DN1 has its cathode terminal connected to the connection terminal pzt and its anode terminal connected to the second inner circuit node X2, while the second transmission diode DN2 has its anode terminal connected to the connection terminal pzt and its cathode terminal connected to the second inner circuit node X2.

The control transistor MD is connected to the ends of the diode block 7 and has its control terminal XD connected to the first inner circuit node X1.

In the example of the figure, the control transistor MD is a low voltage N channel MOS transistor.

In conclusion, the low voltage switch as described is able to transmit high voltage signals (for example at +/−100V) or to isolate, when open, a connection terminal to a piezoelectric transducer, ensuring in this way a high immunity against the capacitive couplings of a corresponding input signal, ensuring at the same time a correct working of the transmission channel that comprises it according to all its working conditions.

The low voltage isolation switch 1 ensures a protection of the control transistor MD, which is a low voltage transistor, thanks to the presence of the voltage limiter block 6 and independently from the driving block 5.

In particular, the limiter block 6 comprises clamp circuits realized by diodes or diode-connected transistors.

The transmission channel 10 thus comprises a low voltage isolation switch 1 that includes a driving block 5 realized by high voltage transistors, electrically coupled with diodes and a resistor, as well as a limiter block 6 realized by two clamp elements connected in antiparallel.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A low voltage isolation switch, comprising:
   first and second connection terminals;
   first and second voltage reference terminals;
   a driving block electrically coupled between the first and second voltage reference terminals and including:
      a first driving transistor electrically coupled between said first voltage reference terminal and a driving circuit node; and
      a second driving transistor electrically coupled between said driving circuit node and said second voltage reference terminal;
   an isolation block electrically coupled to the first and second connection terminals and to said driving circuit node, said isolation block including:
      a diode block electrically coupled between the first and second connection terminals;
      a control transistor electrically coupled across said diode block between said first and second connection terminals and having a control terminal electrically coupled to said driving circuit node;
      a voltage limiter block electrically coupled between the first connection terminal and the control terminal of the control transistor; and
   a resistor electrically coupling the isolation block to the driving circuit node.

2. The low voltage isolation switch according to claim 1, wherein said voltage limiter block comprises:
   first and second voltage limiter circuits electrically coupled between first and second inner circuit nodes, said first inner circuit node being electrically coupled through the resistor to said driving circuit node and said second inner circuit node being electrically coupled to said first connection terminal.

3. The low voltage isolation switch according to claim 2, wherein said diode block comprises first and second transmission diodes connected in antiparallel between said second connection terminal and said second inner circuit node.

4. The low voltage isolation switch according to claim 2, wherein said control terminal of said control transistor is electrically coupled to said first inner circuit node.

5. The low voltage isolation switch according to claim 2, wherein said first voltage limiter includes a first plurality of diodes electrically coupled in series with each other and the second voltage limiter includes a second plurality of diodes electrically coupled in series with each other.

6. The low voltage isolation switch according to claim 1, wherein said control transistor is a low voltage N channel MOS transistor.

7. A transmission channel, comprising:
   an input terminal configured to receive a high voltage signal;
   a connection terminal configured to be electrically coupled to a load;
   a matrix of high voltage switches electrically coupled between said input terminal and a high voltage node;
   a low voltage output terminal configured to be electrically coupled to a low noise amplifier;
   a transmission switch electrically coupled between said connection terminal and said low voltage output terminal; and
   a low voltage isolation switch that includes:
      first and second voltage reference terminals;
      a driving block electrically coupled between the first and second voltage reference terminals and including:
         a first driving transistor electrically coupled between said first voltage reference terminal and a driving circuit node; and
         a second driving transistor electrically coupled between said driving circuit node and said second voltage reference terminal;
      an isolation block electrically coupled to the high voltage node, the connection terminal, and said driving circuit node, said isolation block including:
         a diode block electrically coupled between the high voltage node and the connection terminal;
         a control transistor electrically coupled across said diode block and between the high voltage node and the connection terminal and having a control terminal electrically coupled to said driving circuit node;
         a voltage limiter block electrically coupled between the high voltage node and the control terminal of the control transistor; and
      a resistor electrically coupling the isolation block to the driving circuit node.

8. The transmission channel according to claim 7, wherein said voltage limiter block comprises:
   first and second voltage limiter circuits electrically coupled between first and second inner circuit nodes, said first inner circuit node being electrically coupled through the resistor to said driving circuit node and said second inner circuit node being electrically coupled to said high voltage node.

9. The transmission channel according to claim 8, wherein said diode block comprises first and second transmission diodes connected in antiparallel between said connection terminal and said second inner circuit node.

10. The transmission channel according to claim 8, wherein said control terminal of said control transistor is electrically coupled to said first inner circuit node.

11. The transmission channel according to claim 8, wherein said first voltage limiter includes a first plurality of diodes electrically coupled in series with each other and the second voltage limiter includes a second plurality of diodes electrically coupled in series with each other.

12. The transmission channel according to claim 7, wherein said control transistor is a low voltage N channel MOS transistor.

13. A device, comprising:
a transducer; and
a transmission channel electrically coupled to the transducer and configured to supply a high voltage signal to the transducer, the transmission channel including:
an input terminal configured to receive the high voltage signal;
a connection terminal electrically coupled to the transducer; and
a low voltage isolation switch configured to transmit the high voltage signal via the connection terminal to the transducer, the isolation switch including:
first and second voltage reference terminals;
a driving block electrically coupled between the first and second voltage reference terminals and including:
a first driving transistor electrically coupled between said first voltage reference terminal and a driving circuit node; and
a second driving transistor electrically coupled between said driving circuit node and said second voltage reference terminal;
an isolation block electrically coupled to the input terminal, the connection terminal, and said driving circuit node, said isolation block including:
a diode block electrically coupled between the input terminal and the connection terminal;
a control transistor electrically coupled across said diode block and between the input terminal and the connection terminal and having a control terminal electrically coupled to said driving circuit node;
a voltage limiter block electrically coupled to the control terminal he control transistor; and
a resistor electrically coupling the isolation block to the driving circuit node.

14. The device according to claim 13, wherein the transducer is an ultrasound transducer configured produce an ultrasound pulse based on the high voltage signal.

15. The device according to claim 14, wherein the transmission channel includes:
a matrix of high voltage switches electrically coupled between said input terminal and a high voltage node;
a low voltage output terminal configured to be electrically coupled to a low noise amplifier; and
a transmission switch electrically coupled between said connection terminal and said low voltage output terminal.

16. The device according to claim 13, wherein said voltage limiter block comprises:
first and second voltage limiter circuits electrically coupled between first and second inner circuit nodes, said first inner circuit node being electrically coupled through the resistor to said driving circuit node and said second inner circuit node being electrically coupled to said input terminal.

17. The device according to claim 16, wherein said diode block comprises first and second transmission diodes connected in antiparallel between said connection terminal and said second inner circuit node.

18. The device according to claim 16, wherein said control terminal of said control transistor is electrically coupled to said first inner circuit node.

19. The device according to claim 16, wherein said first voltage limiter includes a first plurality of diodes electrically coupled in series with each other and the second voltage limiter includes a second plurality of diodes electrically coupled in series with each other.

* * * * *

UNITED STATES PATENT AND TRADEMARK OFFICE
CERTIFICATE OF CORRECTION

PATENT NO. : 8,791,727 B2
APPLICATION NO. : 13/907468
DATED : July 29, 2014
INVENTOR(S) : Valeria Bottarel et al.

Page 1 of 1

It is certified that error appears in the above-identified patent and that said Letters Patent is hereby corrected as shown below:

Title page, Item (71):
"STMicroelectronics S.r.I., Agrate Brianza (IT)" should read, --STMicroelectronics S.r.l., Agrate Brianza (IT)--.

In the claims

Column 9, Line 32, Claim 13:
"terminal he control transistor; and" should read, --terminal of the control transistor and--.

Signed and Sealed this
Thirteenth Day of October, 2015

Michelle K. Lee
*Director of the United States Patent and Trademark Office*